United States Patent
Williams et al.

(10) Patent No.: US 10,285,303 B2
(45) Date of Patent: May 7, 2019

(54) ELECTRONIC DEVICE WITH INTEGRATED PASSIVE AND ACTIVE COOLING

(71) Applicant: Apple Inc., Cupertino, CA (US)

(72) Inventors: Reuben J. Williams, Mountain View, CA (US); Vinh H. Diep, Palo Alto, CA (US); Jonathan Matheson, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/730,394

(22) Filed: Oct. 11, 2017

(65) Prior Publication Data

US 2019/0021184 A1    Jan. 17, 2019

Related U.S. Application Data

(60) Provisional application No. 62/532,788, filed on Jul. 14, 2017.

(51) Int. Cl.
| | |
|---|---|
| *H05K 7/20* | (2006.01) |
| *F28D 7/00* | (2006.01) |
| *F28D 21/00* | (2006.01) |
| *H01L 23/40* | (2006.01) |
| *G06F 1/20* | (2006.01) |

(52) U.S. Cl.
CPC ............. *H05K 7/20* (2013.01); *F28D 7/0075* (2013.01); *F28D 2021/0029* (2013.01); *G06F 1/203* (2013.01); *H01L 2023/4062* (2013.01); *H05K 7/20145* (2013.01); *H05K 7/20154* (2013.01)

(58) Field of Classification Search
CPC .. H05K 7/20; H05K 7/20136; H05K 7/20145; H05K 7/20154; F28D 7/0075; F28D 2021/0029; H01L 2023/4062; G06F 1/203

USPC .................................................. 361/709–710
See application file for complete search history.

(56) References Cited

U.S. PATENT DOCUMENTS

| | | |
|---|---|---|
| 6,241,007 B1 | 6/2001 | Kitahara et al. |
| 6,442,025 B2 | 8/2002 | Nakamura et al. |
| 6,496,369 B2 | 12/2002 | Nakamura |

(Continued)

FOREIGN PATENT DOCUMENTS

WO     2014/103371 A1     7/2014

OTHER PUBLICATIONS

Non-Final Office Action received for U.S. Appl. No. 15/682,291, dated Jun. 27, 2018, 21 pages.

(Continued)

*Primary Examiner* — Jacob R Crum
(74) *Attorney, Agent, or Firm* — Dentons US LLP

(57) ABSTRACT

An exemplary electronic device with integrated passive and active cooling includes a main logic board, a heat sink, and a cooling fan. A first surface of the heat sink faces the main logic board and contacts a heat-generating component of the main logic board. A second surface of the heat sink faces away from the main logic board and has a recess formed thereon. The heat sink further includes a plurality of fins that surround the recess. The cooling fan is at least partially enclosed within the recess by a fan shroud. The cooling fan is operable to draw air into the recess via channels defined by a first subset of the plurality of fins, and expel air from the recess via channels defined by a second subset of the plurality of fins.

19 Claims, 8 Drawing Sheets

(56) References Cited

U.S. PATENT DOCUMENTS

| | | |
|---|---|---|
| 7,327,578 B2 | 2/2008 | Novotny |
| 7,934,540 B2 | 5/2011 | Joshi et al. |
| 9,861,005 B2 | 1/2018 | Li et al. |
| 2002/0080579 A1 | 6/2002 | Shibasaki |
| 2002/0172008 A1* | 11/2002 | Michael ............... H01L 23/467 361/697 |
| 2003/0024693 A1* | 2/2003 | Petty ............... H01L 23/3735 165/121 |
| 2006/0078428 A1* | 4/2006 | Zheng .................. F04D 17/04 415/206 |
| 2006/0079169 A1* | 4/2006 | Kuo ..................... H01L 23/467 454/184 |
| 2006/0133048 A1 | 6/2006 | Kobayashi et al. |
| 2008/0062645 A1 | 3/2008 | Iijima |
| 2008/0138134 A1 | 6/2008 | Wilde |
| 2008/0232064 A1 | 9/2008 | Sato et al. |
| 2008/0266782 A1 | 10/2008 | Zhang |
| 2009/0262501 A1 | 10/2009 | Claassen et al. |
| 2009/0310296 A1* | 12/2009 | Peng ...................... G06F 1/20 361/679.49 |
| 2009/0314465 A1* | 12/2009 | Zheng ................... H01L 23/38 165/80.3 |
| 2009/0316425 A1* | 12/2009 | Inoue .................... F21V 29/02 362/547 |
| 2010/0073853 A1 | 3/2010 | Suzuki |
| 2010/0142146 A1 | 6/2010 | Hwang et al. |
| 2010/0252234 A1 | 10/2010 | Cambell et al. |
| 2010/0294463 A1* | 11/2010 | Nie ......................... G06F 1/20 165/80.3 |
| 2011/0149504 A1 | 6/2011 | Wikander et al. |
| 2011/0157824 A1 | 6/2011 | Fujiwara |
| 2012/0000625 A1* | 1/2012 | Tan ....................... H01L 23/36 165/80.1 |
| 2012/0075804 A1 | 3/2012 | Chen |
| 2012/0113585 A1* | 5/2012 | Stanley .................. F03D 3/06 361/679.47 |
| 2012/0160462 A1* | 6/2012 | Guan .................. H01L 23/467 165/121 |
| 2012/0186961 A1 | 7/2012 | Oike et al. |
| 2012/0294109 A1 | 11/2012 | Boozer |
| 2012/0308417 A1 | 12/2012 | Hsu et al. |
| 2013/0057776 A1 | 3/2013 | Yamaguchi et al. |
| 2013/0279112 A1 | 10/2013 | Kim et al. |
| 2013/0327507 A1 | 12/2013 | Degner et al. |
| 2014/0086762 A1 | 3/2014 | Horng |
| 2014/0118939 A1 | 5/2014 | Lin et al. |
| 2014/0154067 A1 | 6/2014 | Shih et al. |
| 2014/0185223 A1 | 7/2014 | Matsumoto et al. |
| 2014/0314558 A1 | 10/2014 | Tsai et al. |
| 2015/0016987 A1* | 1/2015 | Yamamoto ........... F04D 19/002 415/213.1 |
| 2015/0023784 A1 | 1/2015 | Koizumi |
| 2015/0152883 A1 | 6/2015 | Dybenko et al. |
| 2015/0342091 A1* | 11/2015 | Scharinger ........ H05K 7/20909 165/80.3 |
| 2015/0377238 A1 | 12/2015 | Fujimoto et al. |
| 2016/0013696 A1 | 1/2016 | Aiello et al. |
| 2016/0133048 A1 | 5/2016 | Acree |
| 2017/0067470 A1 | 3/2017 | Patton et al. |
| 2018/0070472 A1 | 3/2018 | Aiello et al. |

OTHER PUBLICATIONS

International Search Report and Written Opinion received for PCT Patent Application No. PCT/US2017/048504, dated Nov. 6, 2017, 25 pages.

Invitation to Respond to Written Opinion received for Singapore Patent Application No. 10201609616T, dated Jan. 18, 2018, 5 pages.

Notice of Allowance received for Singapore Patent Application No. 10201609616T, dated Mar. 15, 2018, 6 pages.

Search Report and Written Opinion received for Singaporean Patent Application No. 10201609616T, completed on Mar. 14, 2017, 10 pages.

\* cited by examiner

ELECTRONIC DEVICE WITH INTEGRATED PASSIVE AND ACTIVE COOLING

CROSS-REFERENCE TO RELATED APPLICATIONS

This application claims priority from U.S. Provisional Ser. No. 62/532,788, filed on Jul. 14, 2017, entitled "Electronic Device with Integrated Passive and Active Cooling," which is hereby incorporated by reference in its entirety for all purposes.

FIELD

This application relates generally to electronic devices, and more specifically, to electronic devices with integrated passive and active cooling.

BACKGROUND

Electronic devices contain components, such as integrated circuits, that generate heat during operation. As electronic components become smaller and more powerful, they generate more heat in a smaller and more confined area. At the same time, electronic devices are being designed with increasingly small form factors, which can result in components being spaced more closely within the device. This can intensify the effect of heat generated by the components during operation. To maintain the longevity and proper functionality of the device, fans, heat sinks, and/or other heat management components are used to dissipate heat from the device. However, designing heat management components that can be integrated into smaller overall volumes while still providing effective and reliable heat dissipation can create challenges.

SUMMARY

Electronic devices with integrated passive and active cooling are described herein. In one example, an electronic device includes a main logic board, a heat sink, and a cooling fan. A first surface of the heat sink faces the main logic board and contacts a heat-generating component of the main logic board. A second surface of the heat sink faces away from the main logic board and has a recess formed thereon. The heat sink further includes a plurality of fins that surround the recess. The cooling fan is at least partially enclosed within the recess by a fan shroud. The cooling fan is operable to draw air into the recess via channels defined by a first subset of the plurality of fins, and expel air from the recess via channels defined by a second subset of the plurality of fins.

DETAILED DESCRIPTION

Figure 1A:
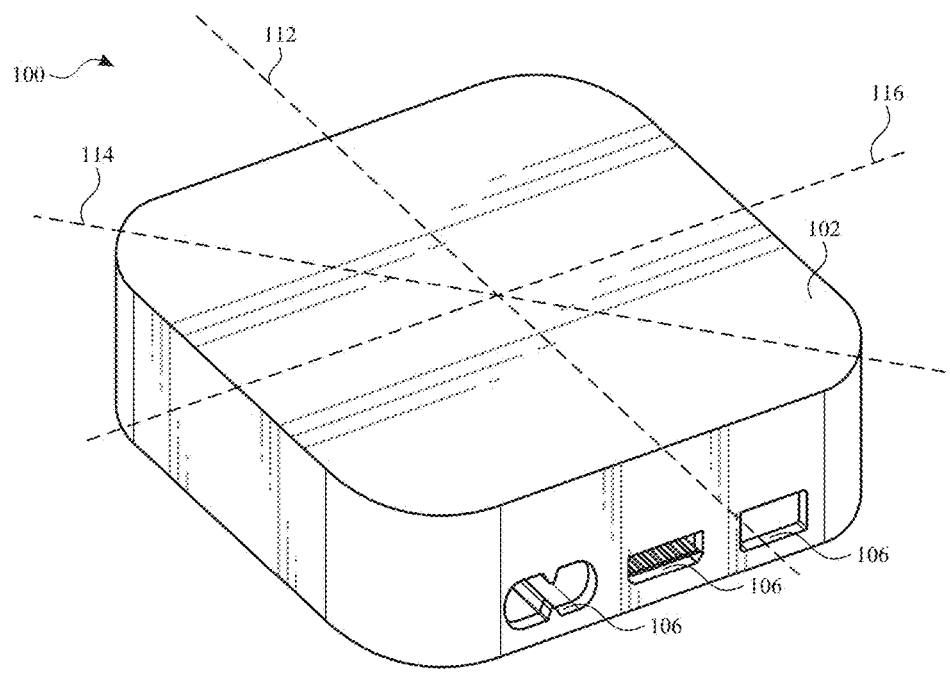
FIG. 1A illustrates a top perspective view of an electronic device, according to various examples.

The following description is presented to enable a person of ordinary skill in the art to make and use the various embodiments. Descriptions of specific devices and applications are provided only as examples. Various modifications to the examples described herein will be readily apparent to those of ordinary skill in the art, and the general principles defined herein may be applied to other examples and applications without departing from the spirit and scope of the various embodiments. Thus, the various embodiments are not intended to be limited to the examples described herein and shown, but are to be accorded the scope consistent with the claims.

Electronic devices contain components that produce heat during normal operation. As such, fans, heat sinks, and other heat diversion components can be used to manage operating temperatures in some electronic devices. Passive thermal-management solutions (e.g., heat sinks) can be desirable for their simplicity, reliability, and low acoustic footprint. However, with increasingly fast and powerful circuitry that generates increased levels of heat, implementing only passive thermal-management solutions can limit the speed and power of electronic components used in the device. Active thermal-management solutions (e.g., cooling fans) can provide greater heat-dissipation rates. However, such solutions can increase the cost, complexity, and overall footprint of the device. In addition, active thermal-management solutions can generate undesirable aeroacoustic noise. In accordance with some embodiments described herein, electronic devices that integrate both passive and active thermal-management solutions are provided. As described in greater detail below, the passive portion of the thermal-management solution can be configured to provide sufficient heat dissipation during a majority (e.g., greater than 50%, 75%, or 90%) of the device's operating conditions. The active portion of the thermal-management solution can be configured to activate only during higher power operating conditions. In this way, the active portion of the thermal-management solution can be relied upon less frequently, which can reduce the acoustic footprint of the electronic device. In addition, as will become apparent in the description below, the passive and active thermal-management structures in the electronic devices are integrated in a manner that can reduce the cost, complexity, and overall footprint of the devices.

In one example of an electronic device with integrated passive and active cooling, a main logic board, a heat sink, and a cooling fan are included. A first surface of the heat sink faces the main logic board and contacts a heat-generating component of the main logic board. A second surface of the heat sink faces away from the main logic board and has a recess formed thereon. The heat sink further includes a plurality of fins that surround the recess. The cooling fan is at least partially enclosed within the recess by a fan shroud.

The cooling fan is operable to draw air into the recess via channels defined by a first subset of the plurality of fins, and expel air from the recess via channels defined by a second subset of the plurality of fins.

Figure 1B:
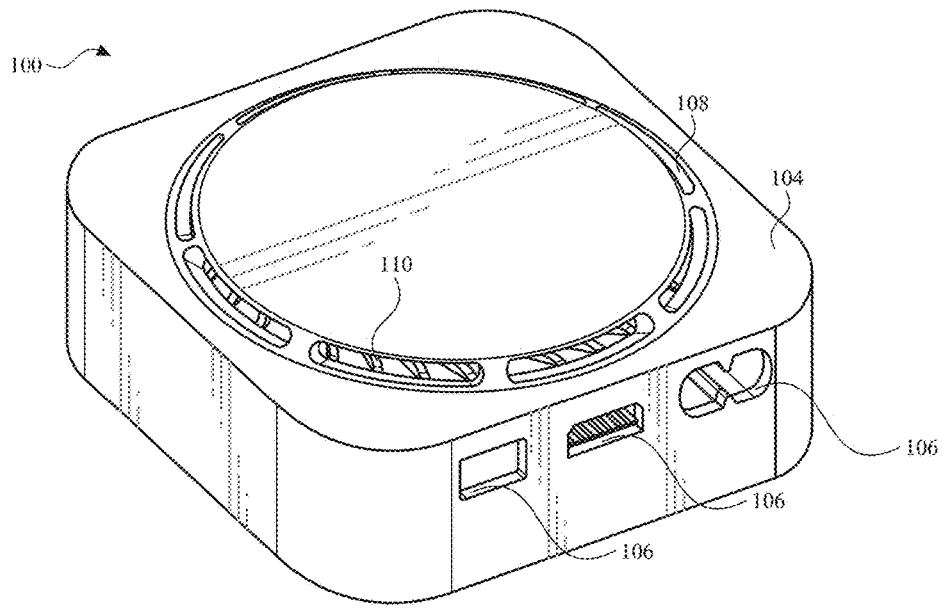
FIG. 1B illustrates a bottom perspective view of an electronic device, according to various examples.

FIGS. 1A-1B illustrate exemplary electronic device 100, according to various examples. Specifically, FIG. 1A illustrates a top perspective view of device 100, and FIG. 1B illustrates a bottom perspective view of device 100. In some examples, device 100 is a computer, a set-top box, a wireless access point, a portable electronic device, or any other suitable electronic device. In a specific example, device 100 is a digital media extender (e.g., an Apple TV®). Device 100 has a device housing that encloses the internal components of the device. In the present example, the device housing of device 100 includes top casing 102 and base 104. Top casing 102 is a single part (e.g., not an assembly of two or more parts) having a top wall and sidewalls. To accommodate connectors for displays, device peripherals, network cables, power cables, and other accessories, a sidewall of top casing 102 includes one or more openings 106 (e.g., port openings).

Figure 7A:
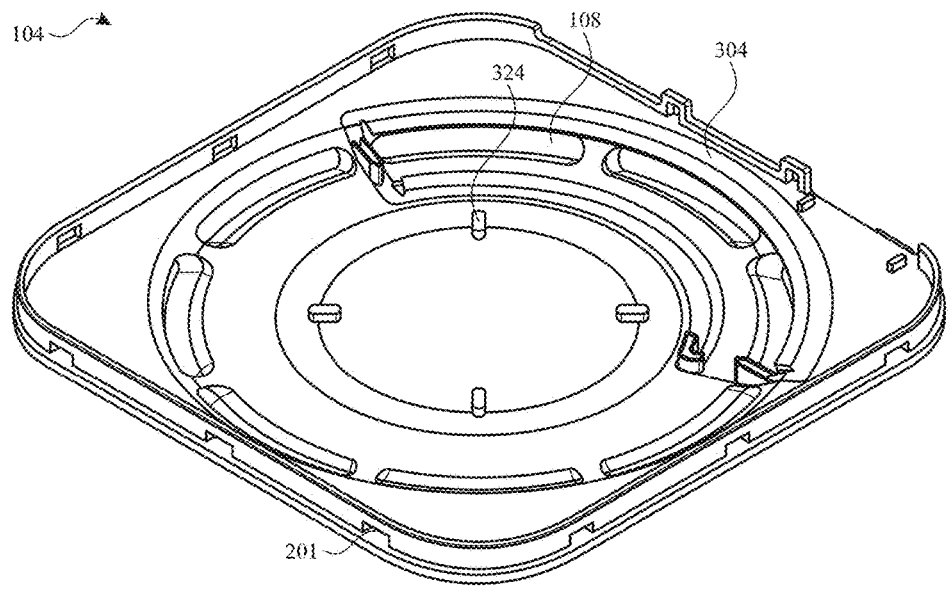
FIGS. 7A-7B illustrate top and bottom perspective views of a base of an electronic device, according to various examples.
Figure 7B:
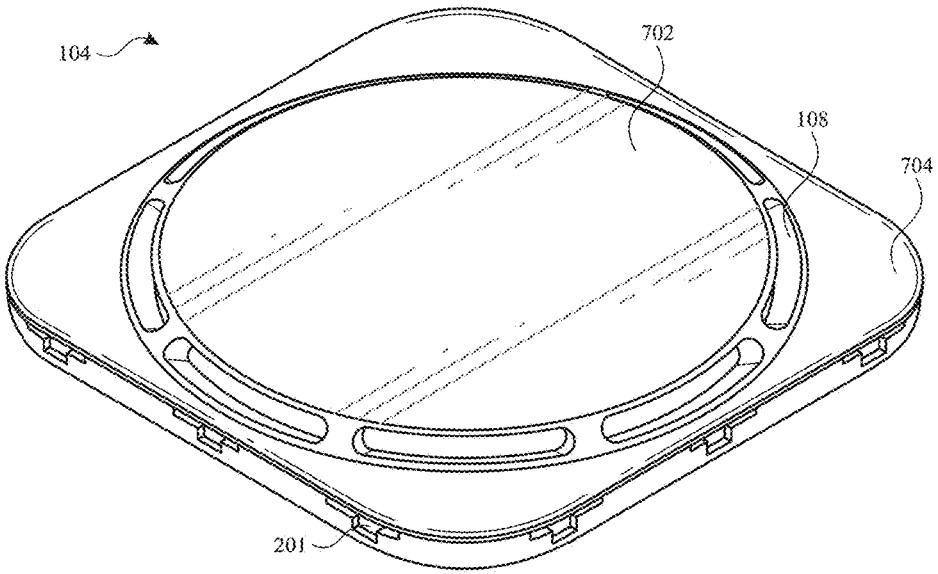

Base 104 forms the bottom wall of the device housing. Like top casing 102, base 104 is a single part. Base 104 engages with the sidewalls of top casing 102 to form the device housing of device 100. For example, base 104 includes features (e.g., openings 201 of FIGS. 2 and 7A-7B) along the edges of base 104 that are configured to engage with corresponding features (e.g., tabs 211 of FIG. 2) along the sidewalls of top casing 102. Base 104 further includes openings 108 that facilitate heat-dissipation. As described in greater detail below, device 100 includes internal electronic components, such as integrated circuits, that generate heat during operation. Thermal-management features are incorporated into the internal structures of electronic device 100 to passively and/or actively dissipate heat from the internal electronic components. Openings 108 allow air flow into and out of device 100. In particular, ambient air is drawn into device 100 via openings 108. The ambient air removes heat from the internal components of device 100 and is discharged from device 100 via openings 108. A more detailed illustration of base 104 is shown in FIGS. 7A-7B, described below.

Although in the present example the device housing of electronic device 100 has two parts (top casing 102 and base 104), it should be appreciated that, in other examples, the device housing of electronic device 100 can include alternative configurations. For example, the device housing can include any number of parts that are assembled together. In the present example, top casing 102 and base 104 are formed of plastic. In other examples, the device housing can be formed of any suitable material, such as glass, ceramic, metal, carbon fiber, fiberglass, or any combination thereof.

Reference lines 112, 114, and 116 are depicted in FIG. 1A. As will become evident in the description below, reference lines 112, 114, and 116 define the orientations of the cross-sectional views of device 100 shown in FIGS. 3A-3C.

Figure 2:
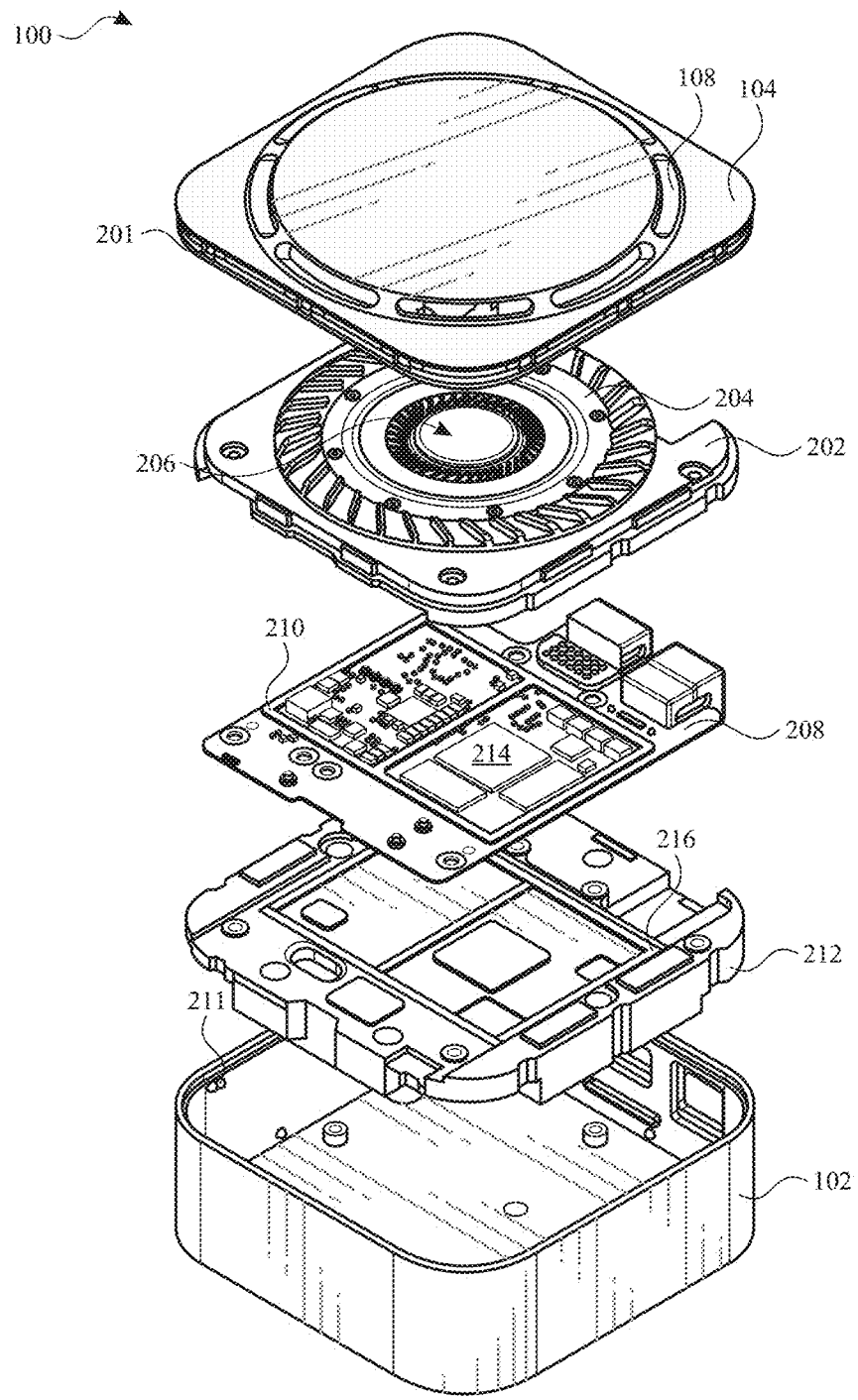
FIG. 2 illustrates an exploded bottom perspective view of an electronic device, according to various examples.

FIG. 2 illustrates an exploded bottom perspective view of device 100, according to various examples. The main internal components of device 100 are depicted in FIG. 2. For simplicity, some internal components (e.g., the power supply unit, such as power supply unit 302 of FIGS. 3B-3C) have been omitted from FIG. 2. As shown, device 100 includes bottom heat sink 202, main logic board 208, and top heat sink 212, which are enclosed within the device housing formed by top casing 102 and base 104. Main logic board 208 includes electronic components (e.g., electronic component 214) that generate heat during operation. The electronic components are disposed on opposite sides of main logic board 208. In the present example, electronic component 214 of main logic board 208 is a system on chip (SOC) that integrates a microprocessor (central processing unit) and peripherals, such as a graphics processing unit (GPU). In other examples, electronic component 214 is a discrete microprocessor or GPU. During operation, electronic component 214 can be the component that generates the most heat per unit time on main logic board 208. Top and bottom heat sinks 212, 202 serve to dissipate heat from main logic board 208 by conducting heat away from the electronic components of main logic board 208. Heat from heat sinks 212, 202 can then dissipate passively into the ambient environment around device 100 (e.g., through the device housing and openings 108). In addition, cooling fan 206 is housed in bottom heat sink 202 to actively dissipate heat from bottom heat sink 202. The manner in which the internal components of device 100 are integrated within the outer housing is shown in greater detail in FIGS. 3A-3C.

Figure 3A:
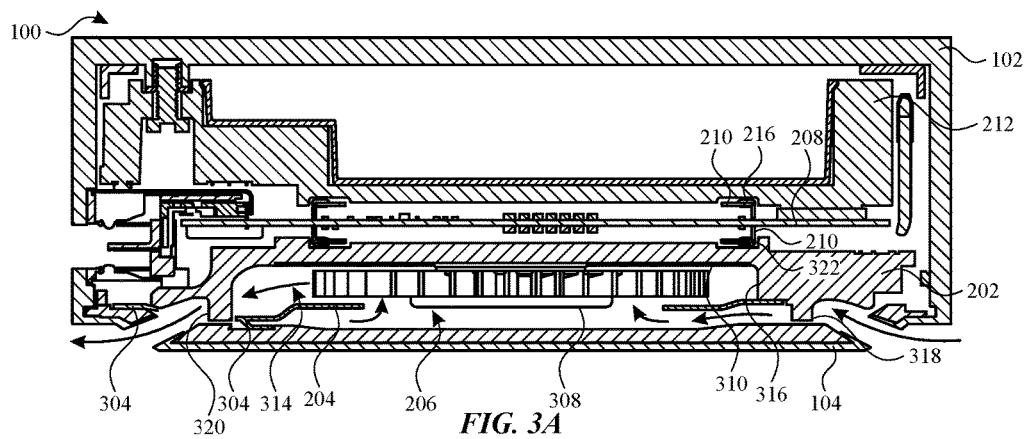
FIGS. 3A-3C illustrate cross-sectional views of an electronic device, according to various examples.
Figure 3B:
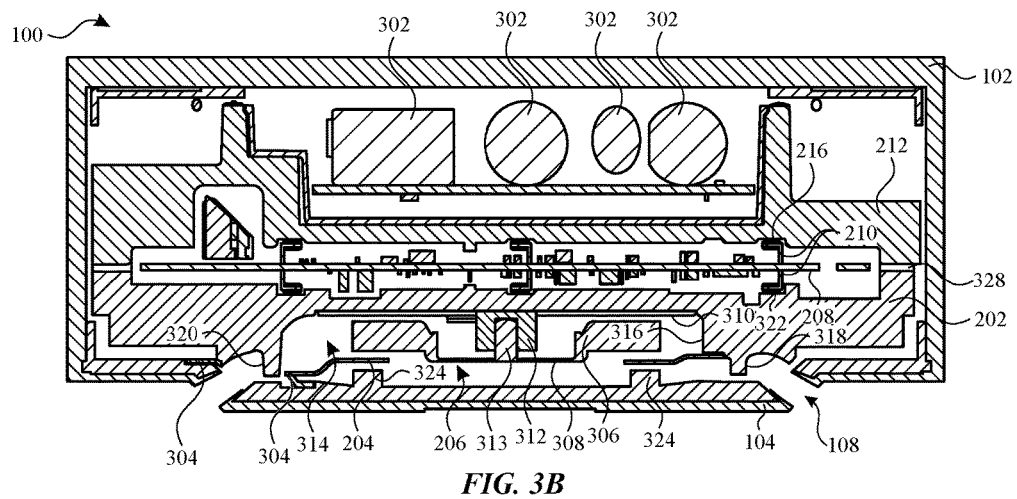
Figure 3C:
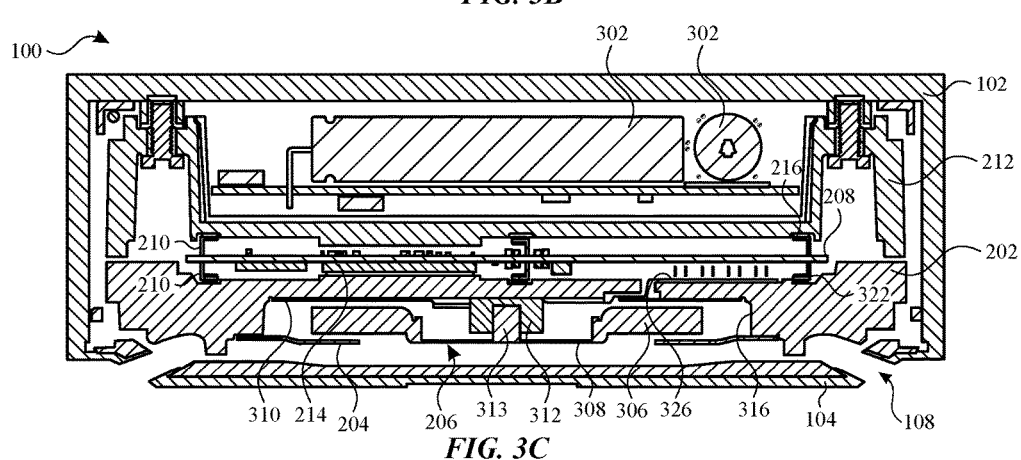

FIGS. 3A-3C illustrate cross-sectional views of device 100, according to various examples. Specifically, FIG. 3A illustrates a cross-sectional view of device 100 along reference line 112 of FIG. 1A, FIG. 3B illustrates a cross-sectional view of device 100 along reference line 114 of FIG. 1A, and FIG. 3C illustrates a cross-sectional view of device 100 along reference line 116 of FIG. 1A. As shown, main logic board 208 is disposed between top and bottom heat sinks 212, 202. One or more heat-generating components (e.g., electronic components) of main logic board 208 contact a first surface of bottom heat sink 202. In some examples, the one or more heat-generating components contact the first surface of bottom heat sink 202 directly or indirectly (e.g., via a thermal interface layer, such as a thermal grease layer or a thermal gap pad). In this way, the one or more heat-generating components are thermally coupled to bottom heat sink 202, which can enable efficient heat transfer from the one or more heat-generating components to bottom heat sink 202. In the present example shown in FIG. 3C, electronic component 214 indirectly contacts a portion of the first surface of bottom heat sink 202 via a thermal interface layer disposed between electronic component 214 and bottom heat sink 202. In particular, electronic component 214 and the first surface of bottom heat sink 202 directly contact opposite sides of the thermal interface layer. The portion of the first surface of bottom heat sink 202 that is in contact with electronic component 214 is more clearly shown in FIG. 8B.

Figure 8A:
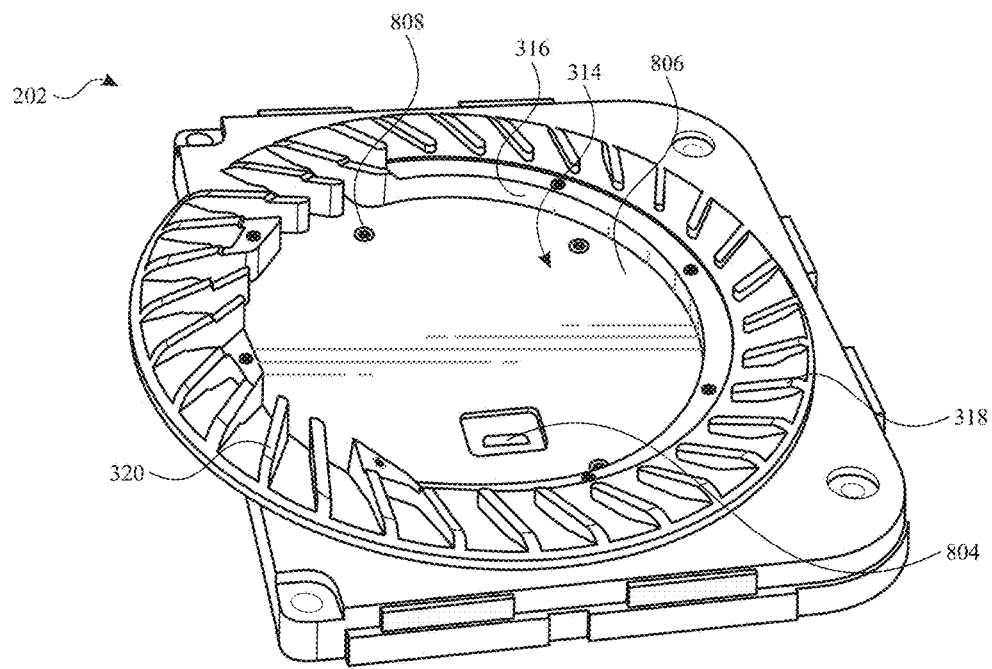
FIGS. 8A-8B illustrate top and bottom perspective views of a bottom heat sink of an electronic device, according to various examples.
Figure 8B:
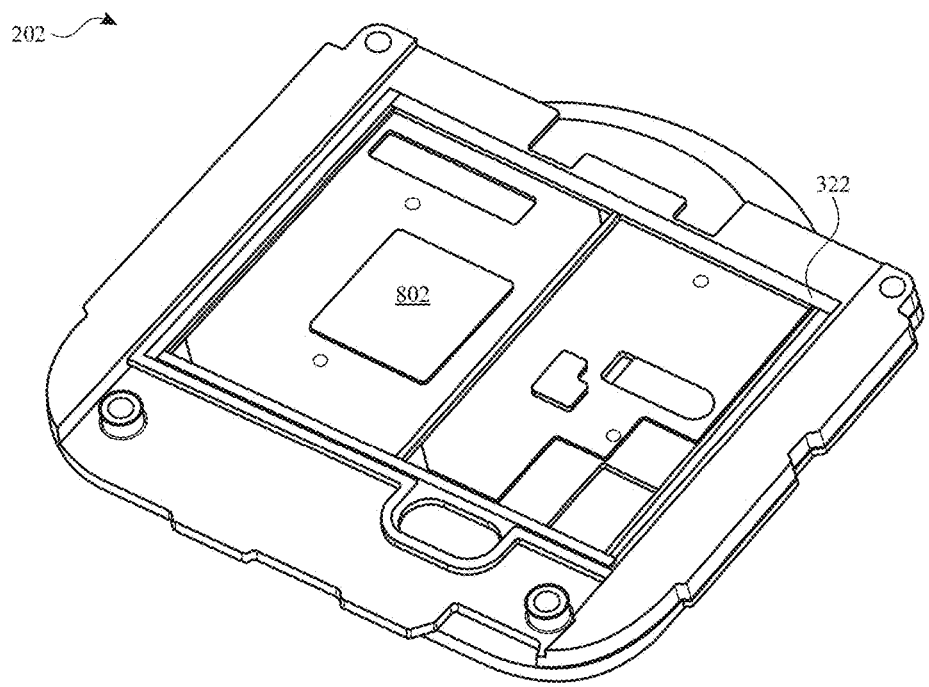

FIGS. 8A-8B illustrate top and bottom perspective views of bottom heat sink 202, according to various examples. Specifically, FIG. 8A is a perspective view of a first side of bottom heat sink 202 that faces base 104 of device 100. FIG. 8B is a perspective view of a second side (e.g., opposite of the first side) of bottom heat sink 202 that faces main logic board 208. As shown in FIG. 8B, the first surface on the second side of bottom heat sink 202 includes portion 802. In some examples, portion 802 protrudes from the first surface of bottom heat sink 202. Electronic component 214 contacts portion 802 of the first surface of bottom heat sink 202 (e.g., via a thermal interface layer), which can enable efficient heat transfer from electronic component 214 to bottom heat sink 202.

As briefly described above, device 100 includes cooling fan 206 that is housed in bottom heat sink 202 to actively dissipate heat from bottom heat sink 202. The manner in which cooling fan 206 is structurally integrated in device 100 is now described with reference to FIGS. 3A, 5, 6, and 8A. As shown in FIG. 8A, the second surface on the first side of bottom heat sink 202 has recess 314 formed thereon.

Figure 6:
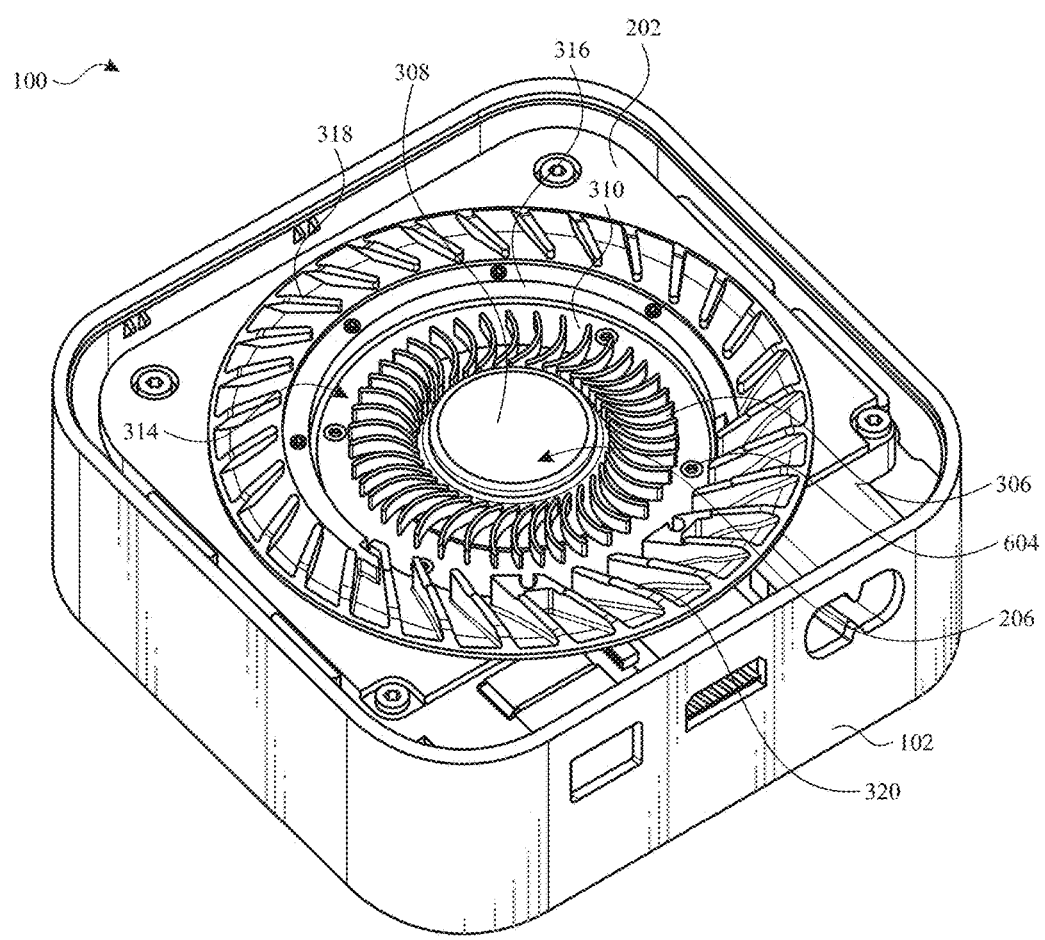
FIG. 6 illustrates a bottom perspective view of an electronic device with the base, seal, and fan shroud omitted, according to various examples.

Cooling fan 206 is disposed within recess 314. For example, referring to FIG. 6, a bottom perspective view of device 100 is illustrated with base 104, seal 304, and fan shroud 204 omitted. As shown in FIG. 6 (and also in FIGS. 3A-3C), cooling fan 206 is disposed within recess 314 of bottom heat sink 202. Cooling fan 206 includes impeller 308 attached to fan motor 312 via fan shaft 313 (FIGS. 3A-3C). Fan motor 312 is operable to rotate impeller 308. Fan motor 312 is attached to fan base 310, which is mounted to the bottom surface of recess 314 by fasteners 604. It should be recognized that, in other examples, fan base 310 is omitted such that cooling fan 206 is attached to bottom heat sink 202 via fan shaft 313 or fan motor 312.

In the present example, with reference to FIG. 8A, fan base 310 is mounted to bottom surface 806. As shown, bottom surface 806 is a substantially continuous surface having a limited number of openings that extend from bottom surface 806 to the first surface on the second side (FIG. 8B) of bottom heat sink 202. A limited number of openings can be desirable to reduce turbulent air flow during operation of cooling fan 206, which can reduce the generation of aeroacoustic noise. In the present example, bottom surface 806 only includes openings 804 and 808. Opening 804 allows the flexible printed circuit board (e.g., flexible printed circuit board 326 of FIG. 3C) of cooling fan 206 to connect with main logic board 208. Openings 808 enable fasteners 604 to mount fan base 310 onto bottom surface 806. In some examples, the openings (e.g., openings 804 and 808) that extend from bottom surface 806 to the first surface of bottom heat sink 202 occupy less than 5%, 10%, or 15% of the total area of bottom surface 806 of recess 314. Additionally, in some examples, no cooling fins are disposed on bottom surface 806 of recess 314.

It should be appreciated that, in device 100, bottom heat sink 202 serves as the structural housing for cooling fan 206. Notably, as shown in FIGS. 3A-3C and 6, cooling fan 206 does not include a separate fan housing that surrounds impeller 308 in the region between the perimeter of impeller 308 and sidewalls 316 of recess 314. In other words, the tips of fan blades 306 of impeller 308 are immediately adjacent to sidewalls 316 of recess 314. But integrating bottom heat sink 202 with cooling fan 206 such that bottom heat sink 202 serves as the structural housing for cooling fan 206, the complexity of the thermal-management solution is reduced. This can reduce the cost and footprint of the device, and also improve the reliability of the device.

As shown in FIGS. 6 and 8A, bottom heat sink 202 includes cooling fins that surround recess 314. The cooling fins serve to provide additional surface area for bottom heat sink 202 to more efficiently dissipate heat passively and/or actively. The cooling fins can be oriented in a manner that reduces aeroacoustic noise. In the present example, cooling fins are oriented radially from recess 314. In some examples, the angle at which each cooling fin is oriented with respect to the rim of recess 314 can be approximately the same. In the present example, the cooling fins are evenly spaced apart around recess 314. In other examples, the spacing between the cooling fins can vary.

The cooling fins include inlet fins 318 and outlet fins 320. As shown, inlet fins 318 surround more than half (e.g., greater than 50% or 60%) the perimeter of recess 314. Inlet fins 318 are positioned apart from the rim of recess 314. Specifically, the edge of each inlet fin 318 facing recess 314 is set back from the rim of recess 314 by a distance (e.g., the same distance for each inlet fin). Outlet fins 320 surround less than half (e.g., less than 50% or 40%) the perimeter of recess 314. Outlet fins 320 define a portion of sidewalls 316 of recess 314. Specifically, the edge of each outlet fin 320 facing recess 314 defines part of sidewalls 316 of recess 314. Outlet fins 320 thus define openings along a portion of sidewalls 316 of recess 314 that allow air to flow out from recess 314. In contrast, as shown in FIGS. 6 and 8A, the portion of sidewalls 316 proximate to inlet fins 318 is a continuous portion of sidewall. Specifically, the portion of sidewalls 316 proximate to inlet fins 318 does not have openings for air to flow out from recess 314.

Each inlet fin 318 has a height that extends from its base at a surface around the rim of recess 314 to its edge that faces base 104. Each outlet fin 320 has a height that extends from its base at bottom surface 806 of recess 314 to its edge, which faces base 104. The height of outlet fins 320 is greater than the height of inlet fins 318. In some examples, portions of the edges of each cooling fin (inlet and outlet fins 318, 320) facing base 104 are aligned with the same plane.

Figure 5:
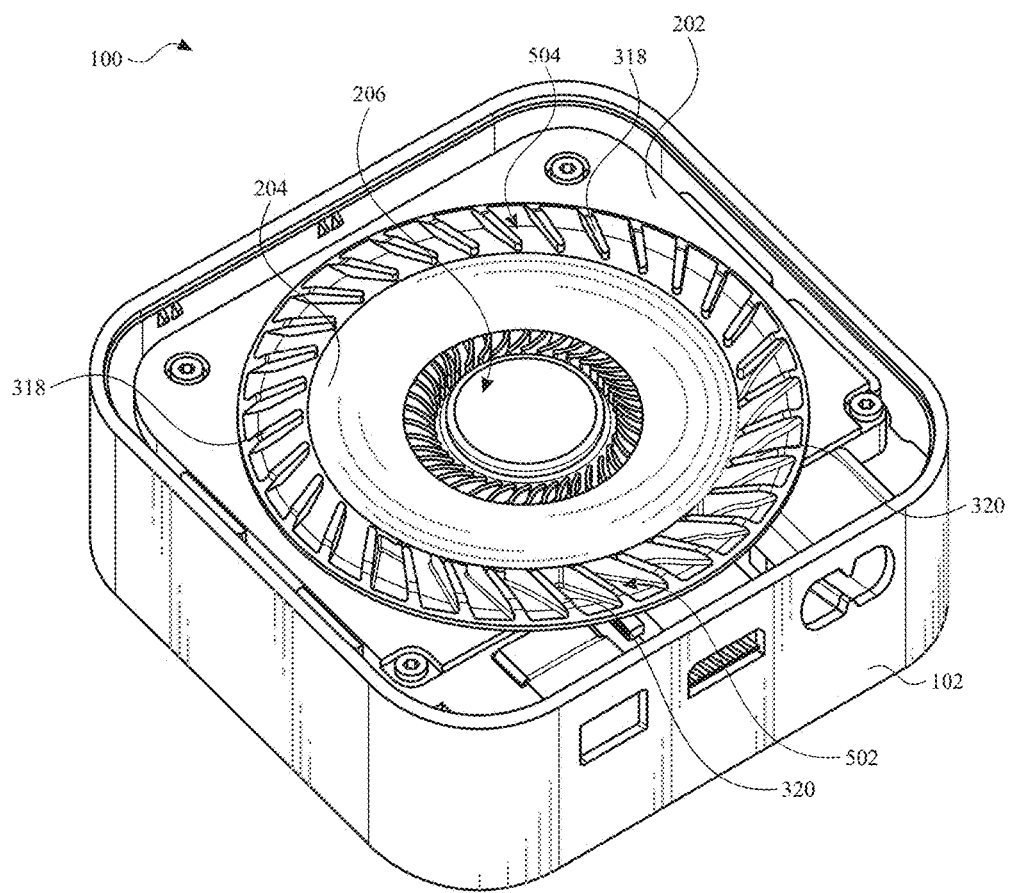
FIG. 5 illustrates a bottom perspective view of an electronic device with the base and seal omitted, according to various examples.

Turning now to FIG. 5, a bottom perspective view of device 100 is illustrated with base 104 and seal 304 omitted. As shown, cooling fan 206 is at least partially enclosed within recess 314 by fan shroud 204. Bottom heat sink 202 and fan shroud 204 thus form the structural housing of cooling fan 206. In the present example, fan shroud 204 is a single part formed of metal only (e.g., aluminum). As discussed in greater detail below, the rigidity associated with fan shroud 204 being a single metal part can be desirable for resisting against deflection of fan shroud 204 toward impeller 308 from user handling of device 100. In other examples, fan shroud 204 includes multiple parts and/or be formed of one or more other materials (e.g., plastic, fiberglass, etc.).

Fan shroud 204 includes an inlet opening that is positioned over the hub of impeller 308. In particular, the center of the inlet opening of fan shroud 204 is substantially aligned with the center of the hub of impeller 308. During operation of cooling fan 206, the inlet opening of fan shroud 204 allows air to be drawn into recess 314. The outer diameter of fan shroud 204 is greater than the diameter of recess 314, where fan shroud 204 extends over the rim of recess 314. In the present example, fan shroud 204 is directly attached to bottom heat sink 202 (e.g., at outlet fins 320 and at the surface between inlet fins 218 and the rim of recess 314) by fasteners or adhesives. A surface of fan shroud 204 facing cooling fan 206 contacts (e.g., directly or indirectly) a surface of bottom heat sink 202 between inlet fins 218 and the rim of recess 314. Inlet fins 218 are positioned apart from fan shroud 204 and do not directly contact fan shroud 204. The surface of fan shroud 204 facing cooling fan 206 also contacts (e.g., directly or indirectly) the edges of outlet fins 320 facing base 104. Fan shroud 204 thus extends over a portion of outlet fins 320 such that fan shroud 204 and outlet fins 320 define channels 502 that are fluidically coupled to recess 314. During operation of cooling fan 206, channels 502 between outlet fins 320 allow air to be expelled from recess 314.

Figure 4:
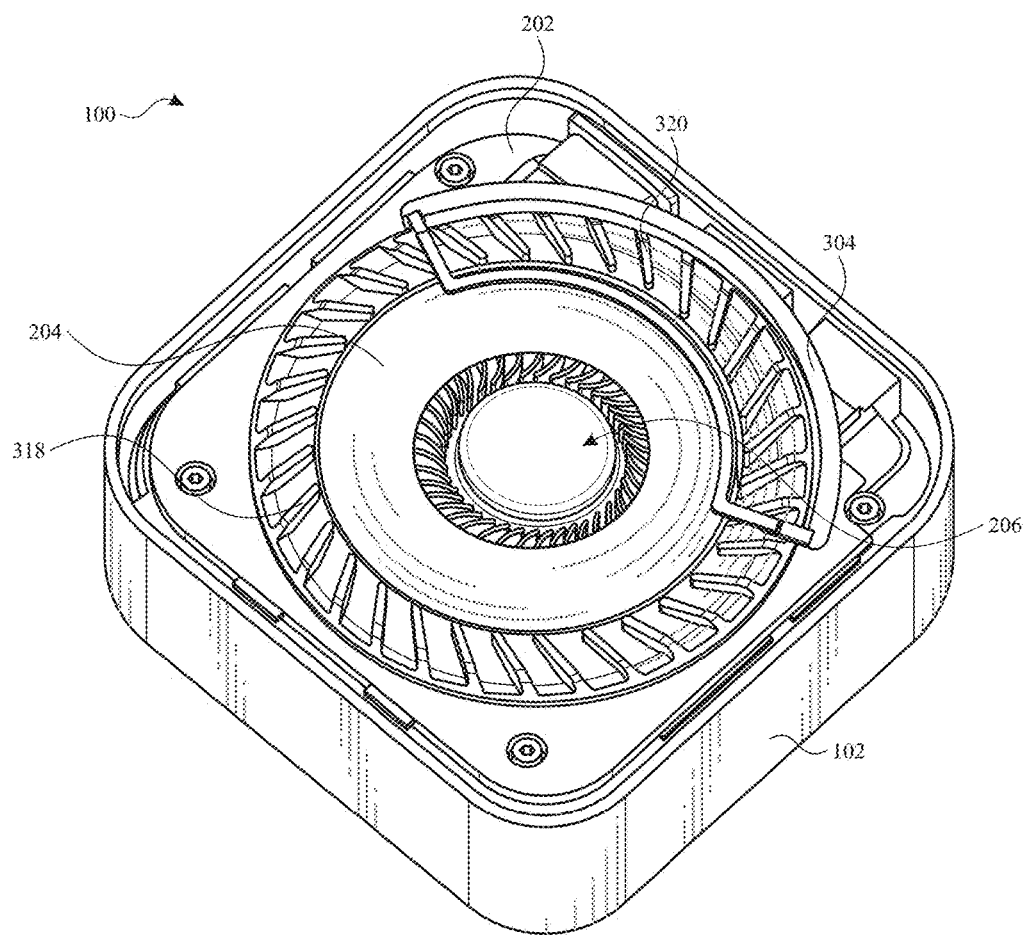
FIG. 4 illustrates a bottom perspective view of an electronic device with the base omitted, according to various examples.

Referring now to FIGS. 3A, 4, and 7A, device 100 further includes seal 304. Seal 304 is formed of plastic or elastomer, and serves to resist heated air that is being expelled from recess 314 (e.g., via channels between outlet fins 320) by cooling fan 206 from being drawn back into recess 314 (e.g., via the inlet opening of fan shroud 204). In particular, seal 304 directs the heated air through a specific subset of openings 108 of base 104. As shown in FIG. 7A, seal 304 is attached (e.g., with an adhesive or fasteners) to the inner surface of base 104. In some examples, seal 304 includes features that engage with corresponding features of base 104. Seal 304 comprises a loop that surrounds a subset of openings 108. Specifically, in the present example, seal 304 surrounds three of openings 108 that are facing a side of device 100 with one or more openings 106 for connectors. By surrounding the three openings of base 104, seal 304 directs the heated air flowing from recess 314 in a common direction away from device 100, thereby reducing the probability of the heated air being drawn back into device 100 via the remaining openings of base 104.

When base 104 is engaged with top casing 102, seal 304 is positioned around outlet fins 320 of bottom heat sink 202, as shown in FIG. 4. FIG. 4 illustrates a bottom perspective view of device 100 with base 104 omitted. Seal 304 surrounds outlet fins 320 and forms a barrier around outlet fins 320. With reference now to FIG. 3A, seal 304 is disposed between bottom heat sink 202 and base 104. Specifically, one side of seal 308 directly contacts a surface of bottom heat sink 202 around outlet fins 320 and a surface of fan shroud 204 adjacent to outlet fins 320. An opposite side of seal 308 directly contacts the inner surface of base 104. Seal 304 defines a passage that fluidically couples the channels between outlet fins 320 to a subset of openings 108. The passage defined by seal 304 directs heated air that is being expelled from recess 314 by cooling fan 206 out through the subset of openings 108. As shown in FIG. 3A, seal 308 forms a barrier between outlet fins 320 and the inlet opening of fan shroud 204, and thus resists heated air that is being expelled from recess 314 by cooling fan 206 from flowing back into recess 314 via the inlet opening of shroud 204.

FIG. 3A illustrates how, during operation of cooling fan 206, air circulates through device 100 between base 104 and bottom heat sink 202 to dissipate heat from bottom heat sink 202. Specifically, as represented by the arrows in FIG. 3A, ambient air is drawn into device 100 through a first subset of openings 108 (e.g., five of openings 108). The ambient air flows through channels (e.g., channels 504 of FIG. 5) defined by inlet fins 318 and over a surface of fan shroud 204 facing base 104 before entering recess 314 through the inlet opening of fan shroud 204. As the air flows through the channels defined by inlet fins 318, heat is transferred from bottom heat sink 202 to the air via inlet fins 318. Additional heat from bottom heat sink 202 is transferred to the air within recess 314. Cooling fan 206 expels heated air from within recess 314 out through openings defined by outlet fins 320 along a portion of sidewalls 316 of recess 314. The expelled heated air flows through channels (e.g., channels 502 of FIG. 5) defined by outlet fins 320 and fan shroud 204 and through the passage defined by seal 308 before exiting device 100 through a second subset of openings 108. As the air flows through the channels defined by outlet fins 320, heat is further transferred from bottom heat sink 202 to the air via outlet fins 320. It should thus be appreciated that, unlike some conventional thermal-management structures, heat is dissipated from bottom heat sink 202 both as air is being drawn into device 100 by cooling fan 206 (e.g., dissipated via inlet fins 318) and as air is being expelled out of device 100 by cooling fan 206 (e.g., dissipated via outlet fins 320).

Although cooling fan 206 can enable the active dissipation of heat from device 100, device 100 can be configured to operate with only passive heat-dissipation (e.g., impeller 308 of cooling fan 206 not rotating) during a majority (e.g., greater than 50%, 75%, or 90%) of device operating conditions. In particular, top heat sink 212 and bottom heat sink 202 are each formed of materials with high conductivity (e.g., metals such as aluminum) that can enable heat from the electronic components of main logic board 208 to be efficiently transferred to top heat sink 212 and bottom heat sink 202. In addition, top heat sink 212 and bottom heat sink 202 can have large masses to achieve higher heat capacities, which can enable larger amounts of heat to be absorbed before an upper allowable temperature limit is reached. For example, the combined mass of top heat sink 212 and bottom heat sink 202 is greater than 50%, 60%, 70%, or 80% of the total mass of device 100. As a result of the large mass of top heat sink 212 and bottom heat sink 202, top heat sink 212 and bottom heat sink 202 can occupy a large volume within the device housing of device 100. For example, as shown in FIGS. 2 and 3A-3C, top heat sink 212 and bottom heat sink 202 occupy greater than 20%, 30%, or 40% of the internal volume within the device housing. In addition, the cross-sectional area of top heat sink 212 and bottom heat sink 202 each occupy greater than 60%, 70%, 80%, or 90% of the inner cross-sectional area of the device housing of device 100. Specifically, as shown in FIGS. 3A and 3C, top heat sink 212 and bottom heat sink 202 each extend substantially from one inner sidewall of the device housing to an opposite inner sidewall of the device housing. In some examples, top heat sink 212 and bottom heat sink 202 are each a single part. For example, inlet fins 318, outlet fins 320, and recess 314 of bottom heat sink 202 are all formed of a single part (rather than from multiple parts assembled together). In some examples, top heat sink 212 and bottom heat sink 202 are each formed of only metal (e.g., aluminum). In a specific example, top heat sink 212 and bottom heat sink 202 are each formed of cast metal.

As shown in FIGS. 3A-3C, top heat sink 212 and bottom heat sink 202 are disposed on opposite sides of main logic board 208 and can dissipate heat from heat-generating components on both sides of main logic board 208. In some examples, one or more heat-generating components (e.g., electronic components, such as integrated circuits) on a side of main logic board 208 facing top heat sink 212 contact (e.g., directly or indirectly) a surface of top heat sink 212. For example, the one or more heat-generating components of main logic board 208 indirectly contact the surface of top heat sink 212 via a thermal interface layer (e.g., thermal grease or thermal gap pad). Specifically, in some examples the one or more heat-generating components and the surface of top heat sink 212 directly contact opposite sides of the thermal interface layer. In this way, the one or more heat-generating components are thermally coupled to top heat sink 212, which can enable efficient heat transfer from the one or more heat-generating components to top heat sink 212.

Top heat sink 212 and bottom heat sink 202 are each configured to provide heat-dissipation for a majority (e.g., greater than 50%, 75%, or 90%) of the heat-generating components of main logic board 208. For example, as shown in FIGS. 2 and 3A-3C, each of top heat sink 212 and bottom heat sink 202 extends at least from one edge of main logic board 208 to an opposite edge of main logic board 208. In some examples, each of top heat sink 212 and bottom heat sink 202 extends across a majority (e.g., greater than 50%, 75%, or 90%) of a respective facing surface of main logic board 208. Thus, a majority (e.g., greater than 50%, 75%, or 90%) of the heat-generating components of main logic board 208 are disposed between top heat sink 212 and bottom heat sink 202, and can efficiently dissipate heat to top heat sink 212 and bottom heat sink 202. This is in contrast to some conventional thermal-management systems of electronic devices that implement a combination of a heat pipe (e.g., that utilizes heat transport fluids), cooling fins, and a cooling fan to dissipate heat from heat-generating components. In these systems, the heat pipe is thermally coupled to only one or two heat-generating components of the electronic device, and thus heat-dissipation is only provided to a very small percentage of heat-generating components of the electronic device. In the present example, device 100 does not include a heat pipe and relies mostly on top heat sink 212 and bottom heat sink 202 for heat-dissipation. This can be advantageous for reducing the cost, reliability, and footprint of the device.

In some examples, top heat sink 212 and bottom heat sink 202 are thermally coupled to each other. For example, portions of top heat sink 212 and bottom heat sink 202 around main logic board 208 and proximate to the device housing are in direct or indirect contact with each other. In a specific example, as shown in FIG. 3B, these portions of top heat sink 212 and bottom heat sink 202 directly contact opposite sides of thermal interface layer 328 (e.g., thermal grease layer or thermal gap pad). This can enable efficient heat transfer between top heat sink 212 and bottom heat sink 202, where top heat sink 212 can dissipate heat from bottom heat sink 202 and vice versa. For example, during operation of cooling fan 206, heat can be transferred from top heat sink 212 to bottom heat sink 202 and actively dissipated from bottom heat sink 202 by air flow generated by cooling fan 206. As a result, top heat sink 212 and bottom heat sink 202 can function in effect as one continuous heat sink having high conductivity and large heat capacity to efficiently dissipate heat from the components of main logic board 208.

Top heat sink 212 and bottom heat sink 202 can thus enable passive heat-dissipation to be the primary thermal-management mechanism for device 100 where cooling fan 206 is inactive for a majority (e.g., greater than 50%, 75%, or 90%) of the operating conditions of device 100. Cooling fan 206 can thus only be activated during less frequent higher power operating conditions where processing loads are particularly high or heavy. This can be desirable for reducing the acoustic footprint of device 100. Moreover, by requiring the activation of cooling fan 206 only for a smaller fraction (e.g., less than 50%, 25%, or 10%) of operating conditions of device 100, the overall reliability and power consumption of device 100 can be improved.

It should be appreciated, that in addition to providing heat-dissipation functions, top heat sink 212 and bottom heat sink 202 also provide structural support for device 100. As depicted in FIGS. 2 and 3A-3C, top heat sink 212 and bottom heat sink 202 extend substantially across opposite sidewalls of the device housing and occupy a significant internal volume (e.g., greater than 20%, 30%, or 40%) within the device housing. Top heat sink 212 and bottom heat sink 202 thus provide structural rigidity to the device housing. For example, top heat sink 212 and bottom heat sink 202 can resist the translation and deformation of the device housing during user handling of device 100. Top heat sink 212 and bottom heat sink 202 also house other internal components of device 100 (e.g., power supply 302, main logic board 208, and cooling fan 206). Thus, top heat sink 212 and bottom heat sink 202 provides structural support and mechanical protection for these internal components during user handling of device 100.

Moreover, top heat sink 212 and bottom heat sink 202 provide electromagnetic interference (EMI) shielding for the electronic components of main logic board 208. In particular, with reference to FIGS. 3A-3C, top heat sink 212 and bottom heat sink 202 define opposite walls of a conductive enclosure that surrounds the electronic components of main logic board 208. In some examples, the conductive enclosure is a metal enclosure. One or more conductive frames 210 are attached to main logic board 208 and form the sidewalls of the conductive enclosure. The one or more conductive frames 210 comprise metal, in some examples.

In a specific example, the one or more conductive frames 210 are formed only of metal. As shown more clearly in FIG. 2, conductive frames 210 surround the electronic components on opposite surfaces of main logic board 208. Referring back to FIGS. 3A-3C, conductive frames 210 physically contact corresponding conductive rails 216, 322 that are attached to the respective surfaces of top heat sink 212 and bottom heat sink 322. In particular, conductive rails 216 and 322 are disposed within grooves formed on the respective surfaces of top heat sink 212 and bottom heat sink 202, and serve as metal gaskets that form a seal between conductive frames 210 and top and bottom heat sinks 212, 202. In some examples, conductive rails 216 comprise metal. In a specific example, conductive rails 216 are formed only of metal. Conductive rails 216, 322 on top heat sink 212 and bottom heat sink 322 are more clearly depicted in FIGS. 2 and 8B, respectively.

The conductive enclosure formed by top heat sink 212, bottom heat sink 202, and conductive frames 210 absorbs EMI generated by the electronic components of main logic board 208. In some examples, the conductive enclosure functions as a faraday cage around the electronic components of main logic board 208. The conductive enclosure thus impedes EMI generated by the electronic components from escaping the conductive enclosure. This can shield EMI-sensitive components (e.g., cooling fan 206, antenna, or wireless communication components) within device 100 from the generated EMI. In addition, the conductive enclosure can resist penetration of external EMI, thereby shielding the electronic components of main logic board 208 from the external EMI. Because top heat sink 212 and bottom heat sink 202 provide EMI shielding around the electronic components of main logic board 208, a separate EMI shielding layer (e.g., aluminized Mylar layer) separate from top heat sink 212 and bottom heat sink 202 can be unnecessary. Specifically, as shown in FIGS. 3A-3C, the electronic components on the side of main logic board 208 facing top heat sink 212 are immediately adjacent to the surface of top heat sink 212. Similarly, the electronic components on the opposite side of main logic board 208 facing bottom heat sink 202 are immediately adjacent to the surface of bottom heat sink 202. Thus, in the present example, device 100 does not include separate EMI shielding layers disposed between the electronic components and top heat sink 212 and/or between the electronic components and bottom heat sink 202. This can be desirable for reducing the cost, complexity, and overall footprint of device 100.

As should be appreciated from the above description, top heat sink 212 and bottom heat sink 202 are configured to serve multiple functions in device 100. In addition to providing passive and active heat-dissipation, top heat sink 212 and bottom heat sink 202 provide structural support for device 100 and its internal components. For example, bottom heat sink 202 serves as the structural housing for cooling fan 206. Furthermore, top heat sink 212 and bottom heat sink 202 provide EMI shielding for the electronic components of main logic board 208. The multiple integrated functions of top heat sink 212 and bottom heat sink 202 can enable efficient thermal-management to be provided with less aeroacoustic noise while reducing the cost, complexity, and overall footprint of device 100.

Turning now to FIGS. 7A-7B, top and bottom perspective views of base 104 are depicted, according to various examples. In particular, FIG. 7A illustrates a perspective view of the inner side of base 104 that faces bottom heat sink 202, and FIG. 7B illustrates a perspective view of the outer side of base 104 that faces away from bottom heat sink 202.

Base 104 includes inner portion 702 and outer portion 704 that surrounds inner portion 702. As shown in FIG. 7B, inner portion 702 protrudes with respect to outer portion 704 in an outward direction away from bottom heat sink 202. Openings 108 are disposed between the inner portion 702 and outer portion 702 of base 104. In this example, openings 108 are symmetrically arranged around inner portion 702. In addition, the size and shape of each opening 108 are substantially uniform with respect to one another. In other examples, the size, shape, and arrangement of openings 108 can vary. As shown in FIG. 1B, openings 108 are positioned around cooling fins 110 (e.g., inlet fins 318 and outlet fins 320) of bottom heat sink 202. In some examples, the outer tips of cooling fins 110 are immediately adjacent to openings 108. For example, a portion of cooling fins 110 extends past outer portion 704 and be positioned between inner portion 702 and outer portion 704.

With reference now to FIGS. 3A and 7A, base 104 further includes one or more protrusions 324 that extend from the inner surface of base 104. Specifically, protrusions 324 extend from the inner surface of the inner portion (e.g. inner portion 702) of base 104. Protrusions 324 serve to resist the inner surface of base 104 from coming into contact with the hub of impeller 308 when the inner portion of base 104 is deflected toward bottom heat sink 202 during user handling. As is more clearly shown in FIG. 3B, protrusions 324 are aligned with fan shroud 204 such that the tips of protrusions 324 are directly adjacent to the surface of fan shroud 204 without physically contacting the surface of the fan shroud. In the present example, base 104 includes four protrusions 324 that are positioned evenly around the inlet opening of fan shroud 204. It should be recognized that, in other examples, base 104 can include any number of protrusions 324. During user handling of device 100, if a load is applied to the outer surface of base 104 to cause the inner portion of base 104 to translate toward bottom heat sink 202, protrusions 324 can physically contact the surface of fan shroud 204 and transfer the load to bottom heat sink 202 (e.g., via outer fins 320 and the surface surrounding the rim of recess 314). In this way, the likelihood that the inner surface of base 104 comes into contact with the hub of impeller 308 to cause fan rubbing can be reduced. This in turn reduces the likelihood of damage to cooling fan 206 during user handling. In addition, as discussed briefly above, it can be desirable for fan shroud 204 to have a strong and rigid construction (e.g., single part formed of metal, such as aluminum). A strong and rigid fan shroud 204 can thus transfer the load from protrusions 324 to bottom heat sink 202 without being deflected toward and physically contacting impeller 308.

The terminology used in the description of the various described examples herein is for the purpose of describing particular examples only and is not intended to be limiting. As used in the description of the various described examples and the appended claims, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

Although the following description uses terms "first," "second," etc. to describe various elements, these elements should not be limited by the terms. These terms are only used to distinguish one element from another. For example, a first surface could be termed a second surface, and, similarly, a second surface could be termed a first surface, without departing from the scope of the various described examples. The first surface and the second surface are both surfaces, but are separate and different surfaces.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the techniques and their practical applications. Others skilled in the art are thereby enabled to best utilize the techniques and various embodiments with various modifications as are suited to the particular use contemplated.

Although the disclosure and examples have been fully described with reference to the accompanying drawings, it is to be noted that various changes and modifications will become apparent to those skilled in the art. Such changes and modifications are to be understood as being included within the scope of the disclosure and examples as defined by the claims.

What is claimed is:

1. An electronic device, comprising:
   a main logic board;
   a heat sink including:
      a first surface facing the main logic board, the first surface contacting a heat-generating component of the main logic board;
      a second surface facing away from the main logic board, the second surface having a recess formed thereon; and
      a plurality of fins each surrounding the recess; and
   a cooling fan at least partially enclosed within the recess by a fan shroud, wherein the cooling fan is operable to draw air into the recess via channels defined by a first subset of the plurality of fins, and to expel air from the recess via channels defined by a second subset of the plurality of fins, wherein each fin in the first subset of the plurality of fins is positioned apart from a rim of the recess and apart from the fan shroud.

2. The device of claim 1, wherein the second subset of the plurality of fins defines a portion of an inner sidewall of the recess.

3. The device of claim 1, wherein the fan shroud directly contacts the second subset of the plurality of fins.

4. The device of claim 1, wherein the cooling fan includes an impeller, and wherein a sidewall of the recess is immediately adjacent to a perimeter of the impeller.

5. The device of claim 4, wherein a diameter of the fan shroud is greater than a diameter of the recess.

6. The device of claim 4, wherein the cooling fan does not include a fan housing disposed between the perimeter of the impeller and the sidewall of the recess.

7. The device of claim 1, wherein the heat sink extends from a first edge of the main logic board to a second edge of the main logic board opposite the first edge of the main logic board.

8. The device of claim 1, wherein the heat-generating component of the main logic board comprises a central processing unit or a graphics processing unit.

9. The device of claim 1, further comprising a second heat sink, wherein the main logic board is disposed between the heat sink and the second heat sink.

10. The device of claim 9, wherein the heat sink and the second heat sink have a combined mass that is greater than half of a mass of the electronic device.

11. The device of claim 9, further comprising a thermal interface layer disposed between the heat sink and the second heat sink, wherein the heat sink and the second heat sink each directly contact the thermal interface layer.

12. The device of claim 9, wherein the main logic board includes a second heat-generating component contacting a surface of the second heat sink.

13. The device of claim 1, further comprising one or more conductive frames that surround one or more heat-generating components of the main logic board.

14. The device of claim 13, wherein the one or more heat-generating components are disposed within a conductive enclosure defined by the heat sink, the second heat sink, and the one or more conductive frames, and wherein the conductive enclosure impedes electromagnetic interference generated by the one or more heat-generating components from escaping the conductive enclosure.

15. The device of claim 1, further comprising a device housing enclosing the main logic board and the heat sink, the device housing including a top casing and a base.

16. The device of claim 15, wherein the heat sink extends from a first side of the device housing to a second side of the device housing opposite the first side of the device housing.

17. The device of claim 15, wherein one or more protrusions extend from an inner surface of the base, and wherein the one or more protrusions are positioned directly adjacent to a surface of the fan shroud without contacting the surface of the fan shroud.

18. The device of claim 15, further comprising a seal positioned between the base of the device housing and the heat sink, the seal surrounding the second subset of the plurality of fins and configured to resist air flowing out of the recess via the channels defined by the second subset of the plurality of fins from being drawn back into the recess via an inlet opening of the fan shroud.

19. The device of claim 1, wherein each fin in the first subset of the plurality of fins extends from a first plane of the heat sink and each fin in the second subset of the plurality of fins extends from a second plane of the heat sink, wherein the second plane corresponds to a base surface of the recess, and wherein the recess is at least partially defined by a continuous sidewall that extends from the second plane towards the first plane.

* * * * *